United States Patent
Ladurner et al.

(10) Patent No.: US 11,971,459 B2
(45) Date of Patent: Apr. 30, 2024

(54) CONTACTLESS MAGNETIC SENSING TRIGGER SYSTEM

(71) Applicant: Infineon Technologies AG, Neubiberg (DE)

(72) Inventors: Sebastian Ladurner, Munich (DE); Richard Heinz, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/820,411

(22) Filed: Aug. 17, 2022

(65) Prior Publication Data

US 2024/0061055 A1 Feb. 22, 2024

(51) Int. Cl.
*G01R 33/07* (2006.01)
*G01R 33/00* (2006.01)
*G01R 33/02* (2006.01)

(52) U.S. Cl.
CPC ....... *G01R 33/072* (2013.01); *G01R 33/0005* (2013.01); *G01R 33/0206* (2013.01)

(58) Field of Classification Search
CPC .............. G01R 33/072; G01R 33/0005; G01R 33/0206
See application file for complete search history.

(56) References Cited

U.S. PATENT DOCUMENTS

| | | |
|---|---|---|
| 5,115,175 A | 5/1992 | Fletcher |
| 2011/0298452 A1* | 12/2011 | Mao ........................ G06F 3/011 324/251 |
| 2014/0100687 A1 | 4/2014 | Ekstrom et al. |
| 2016/0220150 A1* | 8/2016 | Sharonov ............ A61B 5/6847 |
| 2019/0314946 A1* | 10/2019 | Dey, IV ................ B23G 1/225 |
| 2022/0055198 A1* | 2/2022 | Yoshikane ............ B25D 11/06 |
| 2023/0025582 A1* | 1/2023 | Nield .................... G05D 1/0016 |

FOREIGN PATENT DOCUMENTS

| | | |
|---|---|---|
| CN | 110840515 A | 2/2020 |
| DE | 202013104844 U1 | 2/2014 |
| WO | 2019084505 A1 | 5/2019 |

OTHER PUBLICATIONS

Allegro Microsystems., "Low-Noise Linear Hall-Effect Sensor ICs with Analog Output," A1324-DS, Jun. 2022, 13 pages.

(Continued)

*Primary Examiner* — Alvaro E Fortich
(74) *Attorney, Agent, or Firm* — Harrity & Harrity, LLP

(57) ABSTRACT

A sensor system may include a first magnet arranged such that a position of the first magnet corresponds to a position of a trigger element on a linear trajectory. The sensor system may include a second magnet arranged such that a position of the second magnet corresponds to a selected position of a selection element. The sensor system may include a magnetic sensor to detect a strength of a first magnetic field component, a strength of a second magnetic field component, and a strength of a third magnetic field component. The magnetic sensor may be further to determine the position of the trigger element based on the strength of the first magnetic field component and the strength of the second magnetic field component, and to determine the selected position of the selection element based on the strength of the third magnetic field component.

20 Claims, 7 Drawing Sheets

(56) References Cited

OTHER PUBLICATIONS

Kevin TI., "Improving Variable-speed Trigger Switches in Power Tools Through Capacitive Sensing," Industrial—Technical articles, Jul. 2016,4 pages.
Melexis., "Hall-effect magnetic sensor—Low power consumption," Website: https://www.melexis.com/en/product/nlx92213/micropower-low-voltage-hall-effect-latch, 2023, 13 pages.
Texas Instruments., "Design Guide—Contactless, Hall-Effect Variable-Speed Trigger Reference Design With External Field Protection," Dec. 2021,42 Pages.
Texas Instruments., "Hall-Trigger-EVM User's Guide," Dec. 2021, 7 pages.
Waite., "Increasing surgical drill trigger precision and control with inductive and Hall-effect sensors," Analog Technical articles, Oct. 2022, 4 pages.

\* cited by examiner

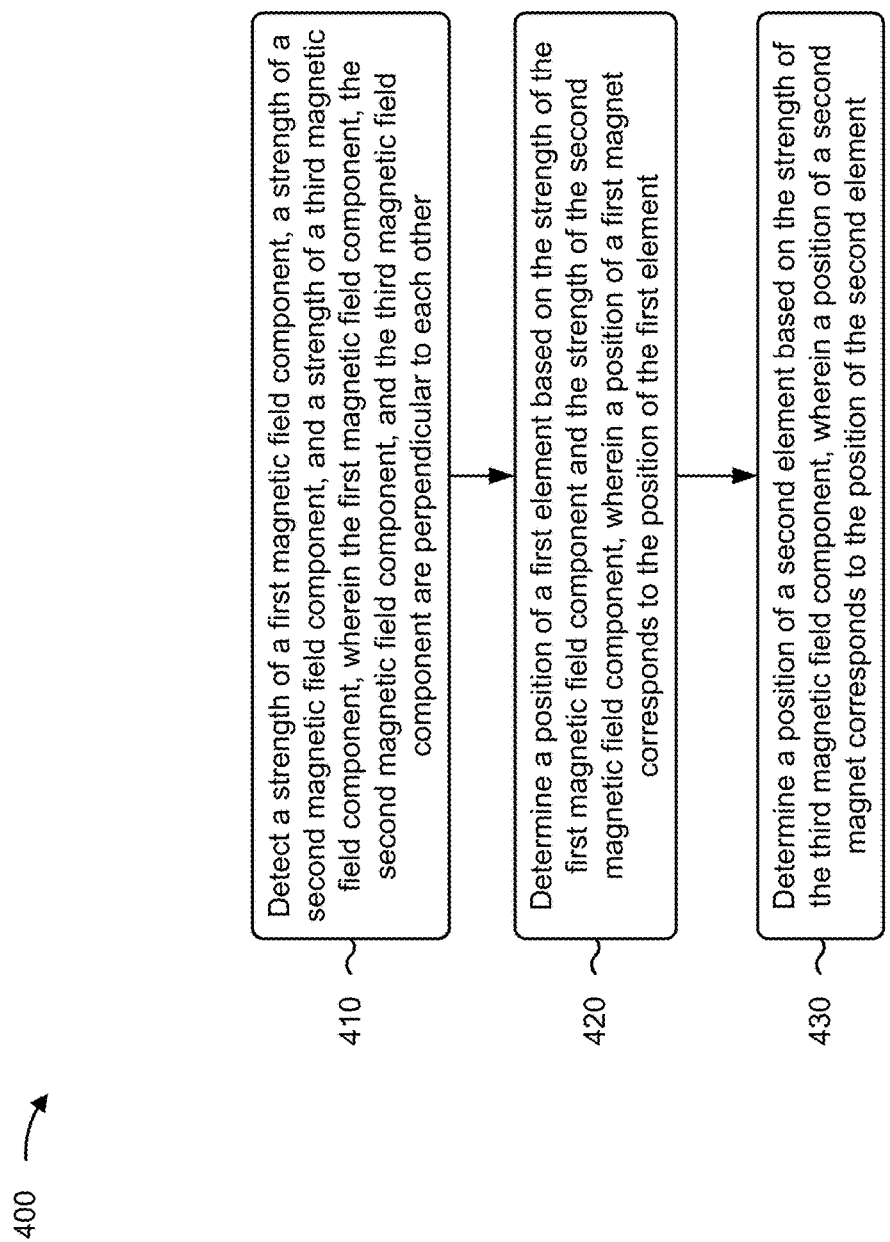

CONTACTLESS MAGNETIC SENSING TRIGGER SYSTEM

BACKGROUND

A magnetic sensor is a device capable of sensing a magnetic field strength and providing an output signal that can be used to determine, for example, a linear position of an object, a position of an object in a three-dimensional (3D) space, an angle of rotation of an object, a speed of an object, a direction of movement of an object, or an electrical current, among other examples. One type of magnetic sensor is a Hall-based sensor, which is a magnetic sensor capable of detecting a strength of a magnetic field using the Hall effect, with an output voltage of the Hall-based sensor being directly proportional to the strength of the field.

SUMMARY

In some implementations, a sensor system includes a first magnet arranged such that a position of the first magnet corresponds to a position of a trigger element on a linear trajectory; a second magnet arranged such that a position of the second magnet corresponds to a selected position of a selection element, the selected position being one of a plurality of selectable positions; and a magnetic sensor to: detect a strength of a first magnetic field component, a strength of a second magnetic field component, and a strength of a third magnetic field component, wherein the first magnetic field component, the second magnetic field component, and the third magnetic field component are perpendicular to each other, determine the position of the trigger element based on the strength of the first magnetic field component and the strength of the second magnetic field component, and determine the selected position of the selection element based on the strength of the third magnetic field component.

In some implementations, a device includes a first element moveable along a first axis; a first magnet affixed to the first element such that a position of the first magnet represents a position of the first element with respect to the first axis; a second element rotatable about or moveable on a second axis; a second magnet affixed to the second element such that a position of the second magnet represents a selected position of the second element with respect to the second axis, the selected position being one of a plurality of selectable positions; and a magnetic sensor to: determine the position of the first element based on a strength of a first magnetic field component and a strength of a second magnetic field component, wherein the first magnetic field component is perpendicular to the second magnetic field component, and determine the selected position of the second element based on a strength of a third magnetic field component, wherein the third magnetic field component is perpendicular to the first magnetic field component and to the second magnetic field component.

In some implementations, a method includes detecting, by a magnetic sensor, a strength of a first magnetic field component, a strength of a second magnetic field component, and a strength of a third magnetic field component, wherein the first magnetic field component, the second magnetic field component, and the third magnetic field component are perpendicular to each other; determining, by the magnetic sensor, a position of a first element based on the strength of the first magnetic field component and the strength of the second magnetic field component, wherein a position of a first magnet corresponds to the position of the first element; and determining, by the magnetic sensor, a position of a second element based on the strength of the third magnetic field component, wherein a position of a second magnet corresponds to the position of the second element.

BRIEF DESCRIPTION OF THE DRAWINGS

FIG. 4 is a flowchart of an example process associated with the contactless magnetic sensing trigger system described herein.

DETAILED DESCRIPTION

Figure 1A:
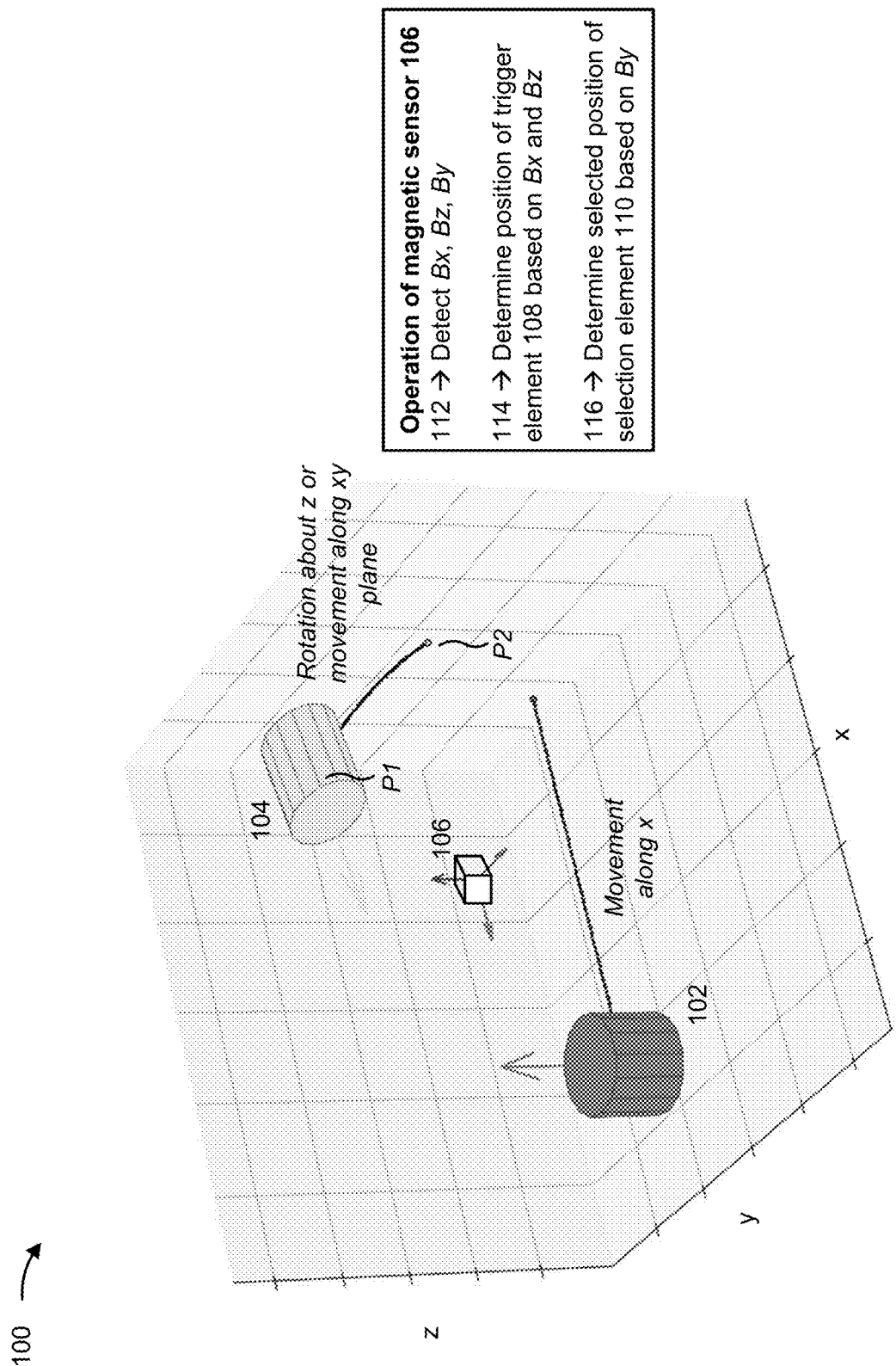
FIGS. 1A and 1B are diagrams illustrating an example associated with a contactless magnetic sensing trigger system described herein.

The following detailed description of example implementations refers to the accompanying drawings. The same reference numbers in different drawings may identify the same or similar elements.

A device may include a trigger that can be manipulated by a user in association with operating the device. For example, a power tool, such as a power drill, may include a trigger that can be manipulated by the user in order to enable control a rotational speed of a motor of the power drill. Conventionally, such a trigger is configured with a resistive potentiometer to enable detection of a position of the trigger, and the rotational speed of the motor can be controlled based on the position of the trigger. Such a device may further include a selection knob that can be manipulated by the user in association with operating the device. For example, in addition to a trigger, a power drill may include a selection knob that can be manipulated by the user in order to enable control of a rotational direction of the motor (e.g., such that a first selected position causes the motor to rotate in a first direction, while a second selected position causes the motor to rotate in a second (opposite) direction). Generally, the selection knob is placed above or near the trigger, and a resistive potentiometer can be used to enable detection of a position of the selection knob. The trigger functionality and the selection knob functionality are in some cases combined within a single system.

However, position detection using a resistive potentiometer has some disadvantages. For example, elements needed to implement detection based on the resistive potentiometer measurement principle require physical contact, and these elements can wear out or degrade over time due to, for example, humidity, exposure to extreme temperature, particle contamination (e.g., dust), limited material durability, or other effects. Therefore, position detection using a resistive potentiometer may become unreliable or error-prone, meaning that control of a device using a trigger or a selection knob may become degraded or impossible.

Some implementations described herein provide a contactless magnetic sensing trigger system. In some implementations, a sensor system may include a first magnet arranged such that a position of the first magnet corresponds to a position of a trigger element on a linear trajectory, and a second magnet arranged such that a position of the second magnet corresponds to a selected position of a selection element. The sensor system may further include a magnetic sensor to detect a strength of a first magnetic field component, a strength of a second magnetic field component, and a strength of a third magnetic field component, determine the position of the trigger element based on the strength of the first magnetic field component and the strength of the second magnetic field component, and determine the selected position of the selection element based on the strength of the third magnetic field component.

Notably, the use of the magnetic sensor and the first and second magnets provide contactless measurement of the position of the trigger element and contactless detection of the selected position of the selection element. As a result, the sensor system described herein overcomes the disadvantages of a resistive potentiometer measurement system (e.g., by eliminating a need for physical contact), thereby improving reliability and performance in association with controlling a device (e.g., a power tool) that includes the trigger element and the selection element. Additional details are provided below.

Figure 1B:
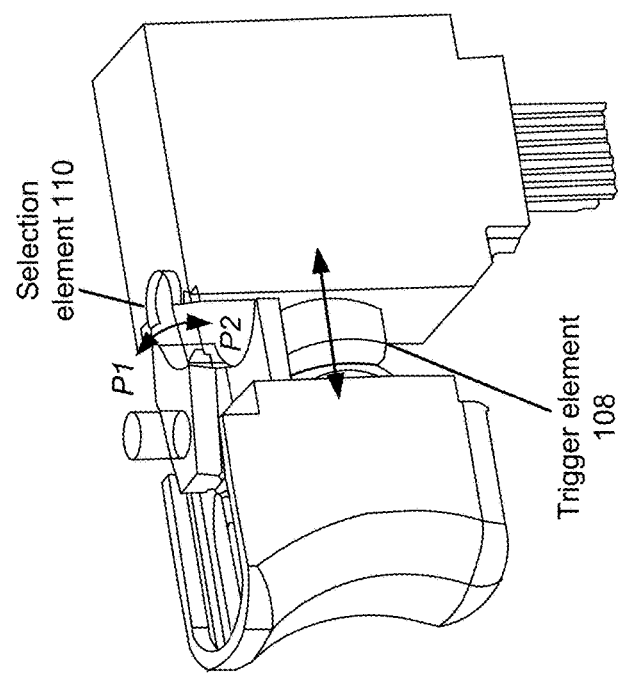

FIGS. 1A and 1B are diagrams illustrating an example associated with a contactless magnetic sensing trigger system 100. As shown in FIGS. 1A and 1B, the contactless magnetic sensing trigger system 100 includes a first magnet 102, a second magnet 104, a magnetic sensor 106, a trigger element 108, and a selection element 110. In some implementations, the contactless magnetic sensing trigger system 100 may be included in a power tool, such as a power drill.

The first magnet 102 is a magnet the influences a magnetic field in an environment of the magnetic sensor 106. In some implementations, the first magnet 102 includes two opposite poles on two portions of the first magnet 102 (e.g., a north pole on a first half of the first magnet 102, a south pole on a second half of the first magnet 102). For example, in some implementations, the first magnet 102 may include a dipole magnet (e.g., a dipole bar magnet, a circular dipole magnet, an elliptical dipole magnet, etc.). Additionally, or alternatively, the first magnet 102 may include another type of magnet, such as an electromagnet, a magnetic tape, or the like. In some implementations, the first magnet 102 comprises a ferromagnetic material (e.g., hard ferrite). In some implementations, the first magnet 102 comprises a rare earth magnet which may be of advantage due to, for example, an intrinsically high magnetic field strength of rare earth magnets.

In some implementations, the first magnet 102 may be affixed or coupled to the trigger element 108 such that a position of the first magnet 102 corresponds to a position of the trigger element 108 on a linear trajectory. For example, as indicated in FIG. 1B, the trigger element 108 may be capable of moving along a linear trajectory (e.g., back and forth) along an x-direction. The first magnet 102 may be affixed or coupled to the trigger element 108 such that, as the trigger element 108 moves along the x-direction, the first magnet 102 also moves along an x-direction. As a result, a position of the first magnet 102 along the x-direction is reflective of the position of the trigger element 108 along the x-direction.

In some implementations, a magnetic field of the first magnet 102 influences a first magnetic field component and a second magnetic field component as the trigger element 108 moves along the linear trajectory. For example, the magnetic field of the first magnet 102 may influence a magnetic field component in the x-direction (herein referred to as an x-component of the magnetic field) and a magnetic field component in the z-direction (herein referred to as a z-component of the magnetic field). In some implementations, the magnetic sensor 106 may determine the position of the trigger element 108 based on the first magnetic field component (e.g., the x-component of the magnetic field) and the second magnetic field component (e.g., the z-component of the magnetic field).

In some implementations, the magnetic field of the first magnet 102 is confined to a first magnetic field component and the second magnetic field component as the trigger element 108 moves along the linear trajectory. That is, the magnetic field of the first magnet 102 may not significantly influence a third magnetic field component (e.g., a magnetic field component in the y-direction, herein referred to as a y-component of the magnetic field). In some implementations, confining the magnetic field of the first magnet 102 to the first magnetic field component and the second magnetic field component enables the magnetic sensor 106 to determine of a selected position of the selection element 110 using the third magnetic field component (e.g., the y-component of the magnetic field) as influenced by a magnetic field of the second magnet 104, as described herein.

The second magnet 104 is a magnet the influences a magnetic field in an environment of the magnetic sensor 106. In some implementations, the second magnet 104 includes two opposite poles on two portions of the second magnet 104 (e.g., a north pole on a first half of the second magnet 104, a south pole on a second half of the second magnet 104). For example, in some implementations, the second magnet 104 may include a dipole magnet. Additionally, or alternatively, the second magnet 104 may include another type of magnet, such as an electromagnet, a magnetic tape, or the like. In some implementations, the second magnet 104 comprises a ferromagnetic material. In some implementations, the second magnet 104 comprises a rare earth magnet which may be of advantage due to, for example, an intrinsically high magnetic field strength of rare earth magnets.

In some implementations, the second magnet 104 may be affixed or coupled to the selection element 110 such that a position of the second magnet 104 corresponds to a selected position of the selection element 110, with the selected position being one of a plurality of selectable positions. For example, as indicated in FIG. 1B, the selection element 110 may be capable of rotating about a z-direction such that the selection element 110 can be in a first selectable position P1 or a second selectable position P2. The second magnet 104 may be affixed or coupled to the selection element 110 such that, as the selection element 110 moves among different selectable positions, the second magnet 104 also moves among different positions. As a result, a position of the second magnet 104 is reflective of the selected position of the selection element 110. In some implementations, the plurality of selectable positions may include two or more selectable positions. In some implementations, the plurality of selectable positions may be arranged in an arc shape (e.g., as illustrated in FIGS. 1A and 1B). In some implementations, the plurality of selectable positions be arranged in a linear direction (e.g., a y-direction, a direction perpendicular to the direction in which the trigger element 108 moves). In some implementations, a magnetic field of the second magnet 104 influences the second magnetic field component and the third magnetic field component as the selection element 110 moves among selectable positions. For example, the magnetic field of the second magnet 104 may influence the z-component of the magnetic field and the y-component of the magnetic field. In some implementations, the magnetic sensor 106 may determine the selected position of the selection element 110 based on the third magnetic field component (e.g., the y-component of the magnetic field), as described herein.

In some implementations, the magnetic field of the second magnet 104 is confined to the second magnetic field component and the third magnetic field component as the selection element 110 moves among selectable positions. That is, the magnetic field of the second magnet 104 may not significantly influence the first magnetic field component (e.g., the x-component of the magnetic field). Further, the magnetic field of the second magnet 104 may have a constant effect on the first magnetic field component (e.g., the x-component of the magnetic field) and the second magnetic field component (e.g., the y-component of the magnetic field) at the magnetic sensor 106, irrespective of the selected position of the selection element 110. That is, regardless of the selected position of the selection element 110, the influence of the magnetic field of the second magnet 104 on the first magnetic field component and the second magnetic field component may be relatively constant. In some implementations, confining the magnetic field of the second magnet 104 to the second magnetic field component and the third magnetic field component, and arranging the second magnet 104 such that the effect on the first magnetic field component and the second component is relatively constant irrespective of the selected position of the selection element 110 enables the magnetic sensor 106 to determine of the position of the trigger element 108 using the first magnetic field component and the second magnetic field component (e.g., x- and z-components of the magnetic field, respectively) as influenced by a magnetic field of the first magnet 102, as described herein.

Magnetic sensor 106 is a magnetic sensor capable of determining the position of the trigger element 108 and/or the selected position of the selection element 110 based on strengths of one or more magnetic field components at the magnetic sensor 106. In some implementations, the magnetic sensor 106 includes one or more sensing elements, where each sensing element is capable of sensing a strength of a particular magnetic field component. For example, the magnetic sensor 106 may in some implementations be a 3D Hall sensor including one or more sensing elements capable of sensing a strength of the first magnetic field component (e.g., the x-component of the magnetic field), one or more sensing elements capable of sensing a strength of the second magnetic field component (e.g., the z-component of the magnetic field), and one or more sensing elements capable of sensing a strength of the third magnetic field component (e.g., the y-component of the magnetic field), with the first magnetic field component, the second magnetic field component, and the third magnetic field component being perpendicular to each other. Additional details regarding magnetic sensor 106 are provided below with respect to FIG. 3.

An example operation of the magnetic sensor 106 is described in FIG. 1A. As shown by reference number 112, the magnetic sensor 106 may detect the strength of the first magnetic field component (Bx), the strength of the second magnetic field component (Bz), and the strength of the third magnetic field component (By).

As shown by reference number 114, the magnetic sensor 106 may determine the position of the trigger element 108 based on the strength of the first magnetic field component and the strength of the second magnetic field component. For example, the magnetic sensor 106 may process a signal indicating the strength of the first magnetic field component and a signal indicating the strength of the second magnetic field component using an inverse tangent (arctan) function, a result of which provides a signal indicating the position of the trigger element 108 along the x-direction.

As shown by reference number 116, the magnetic sensor 106 may determine the selected position of the selection element 110 based on the strength of the third magnetic field component. For example, a signal indicating the strength of the third magnetic field component may have a first value when the selection element 110 is in the first selectable position P1, and may have a second value when the selection element 110 is in the second selectable position P2. Therefore, the magnetic sensor 106 may use the value of the signal to identify the selected position of the selection element 110.

In some implementations, a symmetric design and arrangement of the second magnet 104 results in no significant influence of the second magnet 104 on the determination of the position of the trigger element 108, regardless of whether the selection element 110 is in the selectable position P1 or the selectable position P2. However, even in the case of an asymmetric system (e.g., a system in which an influence of the second magnet 104 on the second magnetic field component is not constant across the selectable positions of the selection element 110), reliable determination of the position of the trigger element 108 is possible. For example, the magnetic sensor 106 may determine the selected position of the selection element 110 (i.e., the position of the second magnet 104) based on the third magnetic field component. Next, with knowledge of the position of the second magnet 104, the magnetic sensor 106 could apply a correction to the second magnetic field component, with the correction being based on the position of the second magnet 104. The magnetic sensor 106 may then determine the position of the trigger element 108 based on the first magnetic field component and the (corrected) second magnetic field component.

In this way, the contactless magnetic sensing trigger system 100 enables contactless detection of the position of the trigger element 108 and the selected position of the selection element 110. As a result, the contactless magnetic sensing trigger system 100 overcomes the disadvantages of a resistive potentiometer measurement system, thereby improving reliability and performance in association with controlling the device (e.g., the power tool).

As indicated above, FIGS. 1A and 1B are provided as examples. Other examples may differ from what is described with regard to FIGS. 1A and 1B. The number and arrangement of elements shown in FIGS. 1A and 1B are provided as an example. In practice, there may be additional elements, fewer elements, different elements, or differently arranged elements than those shown in FIGS. 1A and 1B. Furthermore, two or more elements shown in FIGS. 1A and 1B may be implemented within a single element, or a single element shown in FIGS. 1A and 1B may be implemented as multiple, distributed elements.

Figure 2A:
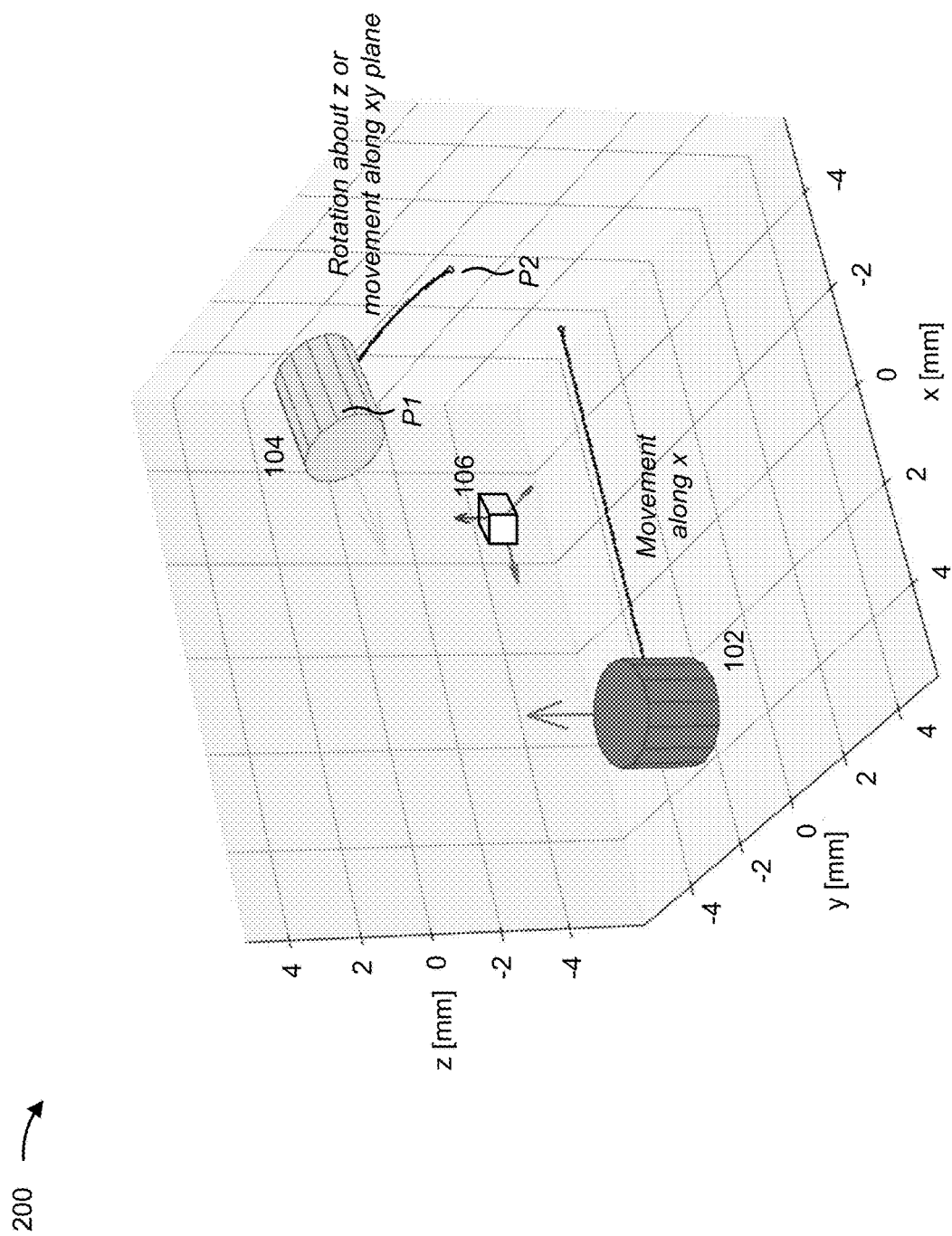
FIGS. 2A-2C are diagrams associated with an example implementation of the contactless magnetic sensing trigger system described herein.
Figure 2B:
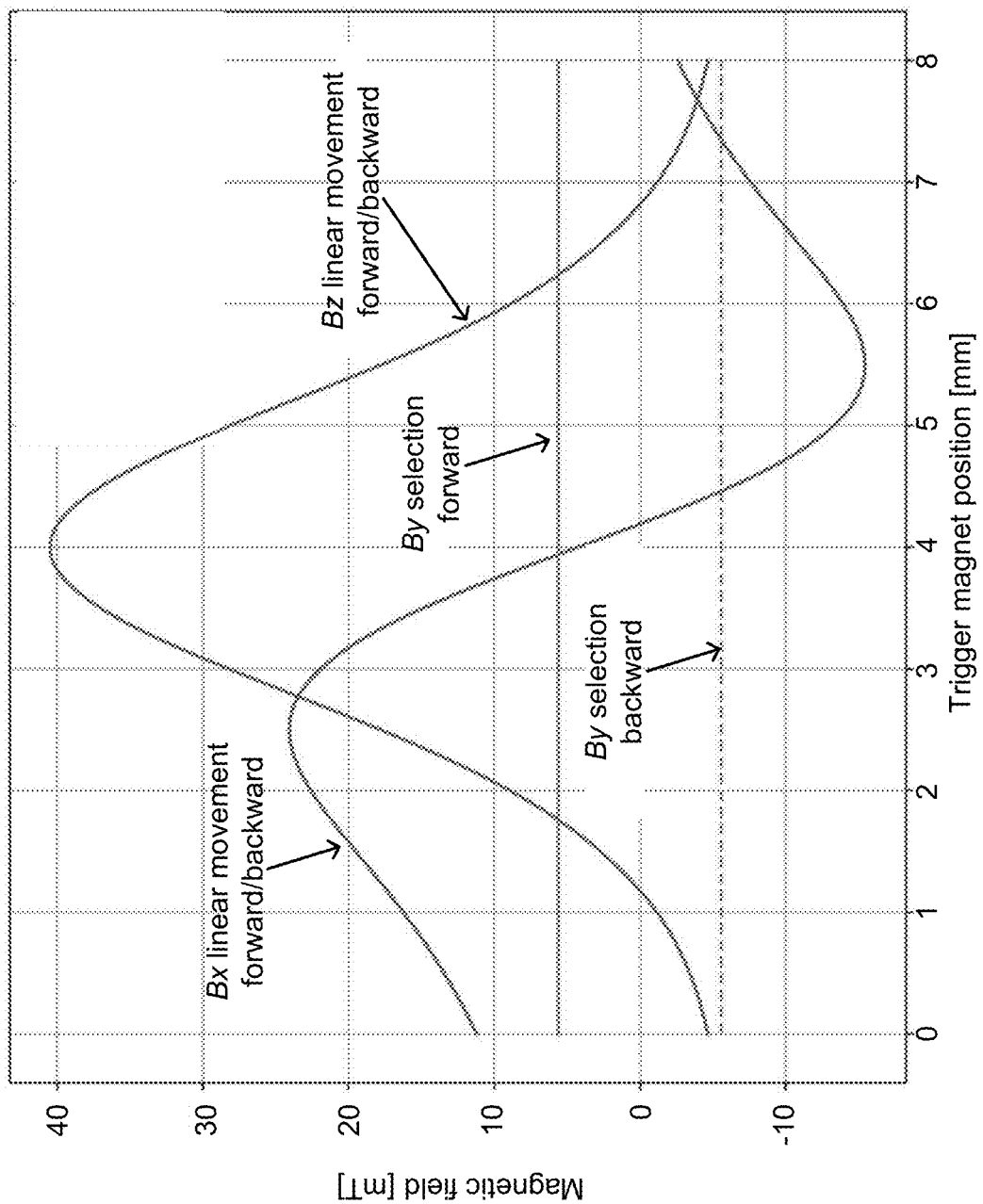
Figure 2C:
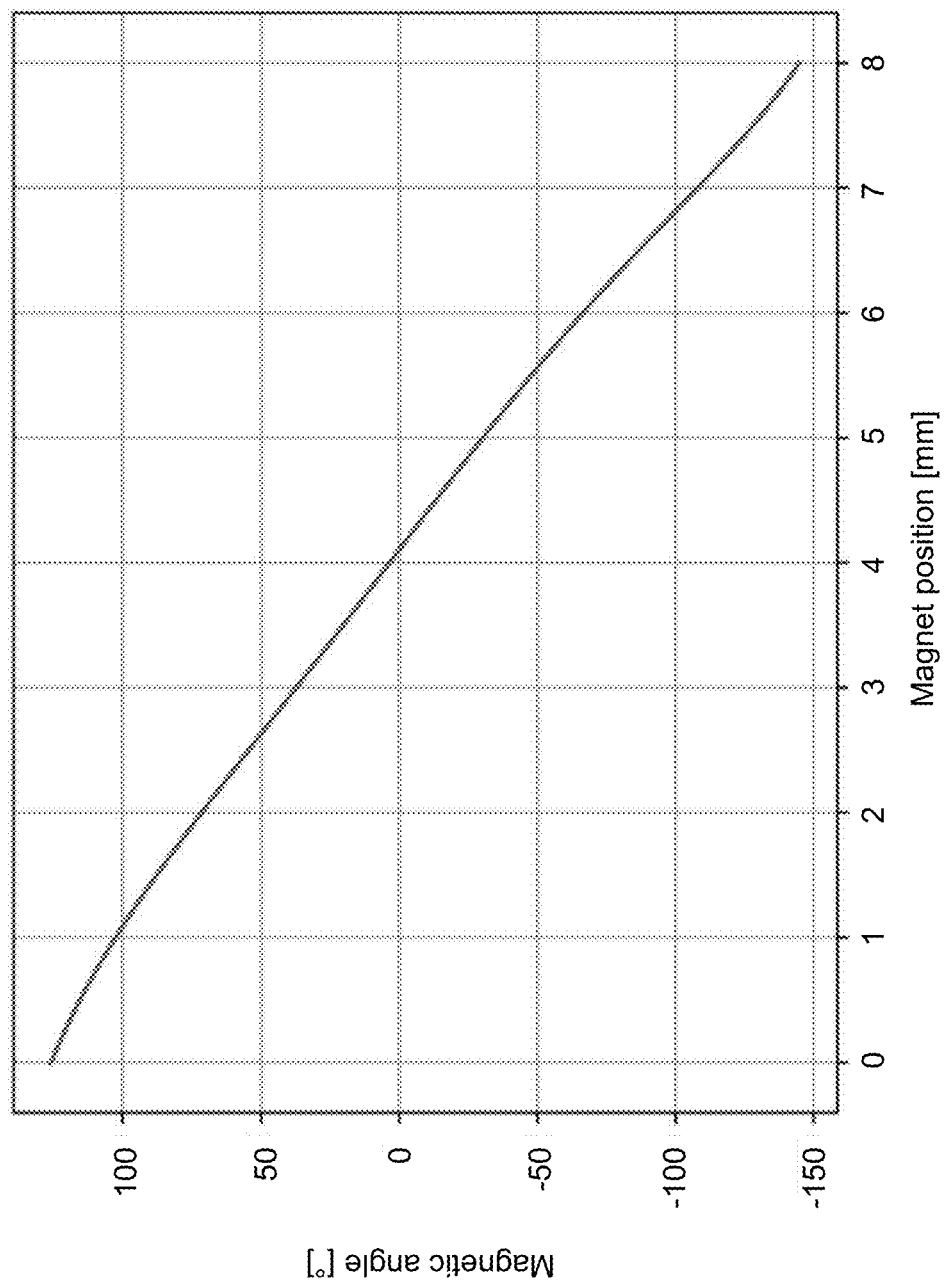

FIGS. 2A-2C are diagrams associated with an example implementation 200 of the contactless magnetic sensing trigger system 100. In FIG. 2A, the first magnet 102 can be moved along a linear trajectory +4 millimeters (mm) to −4 mm in an x-direction, and the second magnet 104 can be moved from +13 degrees)(° to −13° in a y-direction. The magnetic sensor 106 includes a 3D Hall sensor. The magnetic sensor 106 is arranged at a central position (x=0 mm, y=0 mm, z=0 mm), the first magnet 102 is arranged at a first position (x=−4 mm, y=0 mm, z=−3 mm), and the second magnet 104 is arranged at a second position (x=−4 mm, y=0 mm, z=2 mm).

FIG. 2B is a diagram illustrating signals corresponding to strengths of the magnetic field components (Bx, By, Bz), at the magnetic sensor 106 as the first magnet 102 and the second magnet 104 move in the environment of the magnetic sensor 106. Here, the signals are generated by moving the first magnet 102 from 4 mm to −4 mm in the x-direction (8 mm total), as well as moving the second magnet 104 from −13° to +13° (26° total) about a z-direction and along an x-y plane. Here, the "By selection forward" and "By selection backward" signals illustrate that the position of the second magnet 104 (and therefore the selected position of the selection element 110) can be readily determined without influences generated by the first magnet 102.

Notably, the Bx signal (i.e., the signal indicating the strength of the x-component of the magnetic field) and the Bz signal (i.e., the signal indicating the strength of the z-component of the magnetic field) are identical for movement of the trigger element 108 in the forward and backward directions. Determination of the position of the first magnet 102 (and therefore the position of the trigger element 108) can be performed using the arctan function. For example, a value of the Bx signal and a value of the Bz signal can be used to determine a magnetic angle (e.g., an angle of the first magnet 102 with respect to the magnetic sensor 106). Here, as shown in FIG. 2C, the magnetic angle of the first magnet 102 can be translated to a position of the first magnet 102 (e.g., due to a near linear relationship between magnetic angle and position of the first magnet 102). Thus, the arctan function can be readily used to determine the position of the trigger element 108.

As indicated above, FIGS. 2A-2C are provided as an example. Other examples may differ from what is described with regard to FIGS. 2A-2C.

Figure 3:
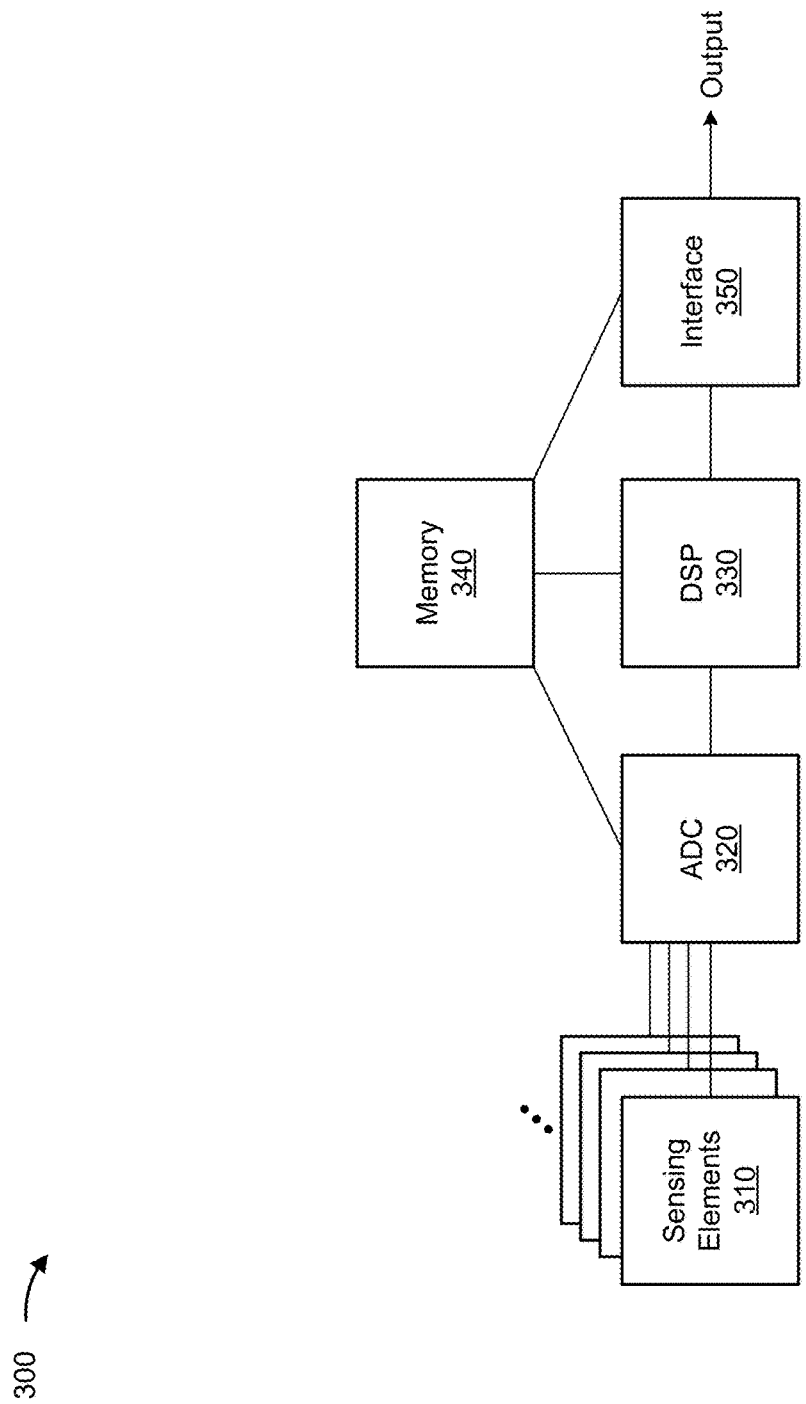
FIG. 3 is a diagram of example elements of the magnetic sensor in the contactless magnetic sensing trigger system described herein.

FIG. 3 is a diagram of example elements 300 of magnetic sensor 106 in in the contactless magnetic sensing trigger system 100. As shown in FIG. 3, magnetic sensor 106 may include a set of sensing elements 310, an analog-to-digital convertor (ADC) 320, a digital signal processor (DSP) 330, a memory element 340, and an interface 350.

Sensing element 310 may include an element for sensing a physical property (e.g., a magnetic field, a temperature, a pressure, or an acceleration, among other examples) in an environment of sensing element 310, and providing and a signal corresponding to the sensed physical property. For example, sensing element 310 may include an element for sensing one or more components of a magnetic field present at the magnetic sensor 106 (e.g., a magnetic field generated by a magnet) and providing a signal corresponding to a strength of the sensed component of the magnetic field. In one particular example, sensing element 310 may include a Hall-based sensing element that operates based on a Hall effect. In some implementations, the magnetic sensor 106 includes multiple Hall-based sensing elements that are sensitive in different directions. For example, the magnetic sensor 106 may include a first Hall-based sensing element configured to sense a first magnetic field component (e.g., an x-component), a second Hall-based sensing element configured to sense a second magnetic field component (e.g., a z-component), and a third Hall-based sensing element configured to sense a third magnetic field component (e.g., a y-component). That is, in some implementations, the magnetic sensor 106 may be a 3D Hall sensor.

In another particular example, sensing element 310 may include a magnetoresistive (MR)-based sensing element, elements of which are comprised of a magnetoresistive material (e.g., nickel-iron (NiFe)), where the electrical resistance of the magnetoresistive material may depend on a strength and/or a direction of the magnetic field present at the magnetoresistive material. Here, sensing element 310 may operate based on an anisotropic magnetoresistance (AMR) effect, a giant magnetoresistance (GMR) effect, a tunnel magnetoresistance (TMR) effect, and/or the like. As an additional particular example, sensing element 310 may include a variable reluctance (VR) based sensing element that operates based on induction.

Notably, the above-described examples of sensing element 310 are provided for illustrative purposes and, in practice, sensing element 310 may include any type of element capable of sensing a physical property and providing a signal corresponding to the physical property.

ADC 320 may include an analog-to-digital converter that converts an analog signal from the set of sensing elements 310 to a digital signal. For example, ADC 320 may convert analog signals, received from the set of sensing elements 310, into digital signals to be processed by DSP 330. ADC 320 may provide the digital signals to DSP 330. In some implementations, magnetic sensor 106 may include one or more ADCs 320.

DSP 330 may include a digital signal processing device or a collection of digital signal processing devices. In some implementations, DSP 330 may receive digital signals from ADC 320 and may process the digital signals to form output signals (e.g., destined for a controller), such as an output signal that conveys sensor data, as described elsewhere herein.

Memory element 340 may include a read only memory (ROM) (e.g., an EEPROM), a random access memory (RAM), and/or another type of dynamic or static storage device (e.g., a flash memory, a magnetic memory, an optical memory, etc.) that stores information and/or instructions for use by magnetic sensor 106. In some implementations, memory element 340 may store information associated with processing performed by DSP 330. Additionally, or alternatively, memory element 340 may store configurational values or parameters for the set of sensing elements 310 and/or information for one or more other elements of magnetic sensor 106, such as ADC 320 or interface 350.

Interface 350 may include an interface via which magnetic sensor 106 may receive and/or provide information from and/or to another device in a system, such as a controller. For example, interface 350 may provide the output signal, determined by DSP 330, to the controller and may further receive information from the controller.

The number and arrangement of elements shown in FIG. 3 are provided as one or more examples. In practice, there may be additional elements, fewer elements, different elements, or differently arranged elements than those shown in FIG. 3. Furthermore, two or more elements shown in FIG. 3 may be implemented within a single element, or a single element shown in FIG. 3 may be implemented as multiple, distributed elements. Additionally, or alternatively, a set of elements (e.g., one or more elements) of magnetic sensor 106 may perform one or more functions described as being performed by another set of elements of magnetic sensor 106.

FIG. 4 is a flowchart of an example process 400 associated with the contactless magnetic sensing trigger system 100. In some implementations, one or more process blocks of FIG. 4 are performed by a magnetic sensor (e.g., magnetic sensor 106). In some implementations, one or more process blocks of FIG. 4 are performed by another device or a group of devices separate from or including the magnetic sensor, such as one or more sensing elements (e.g., one or more sensing elements 310), an ADC (e.g., ADC 320), a DSP (e.g., DSP 330), a memory (e.g., memory 340), and/or an interface (e.g., interface 350).

As shown in FIG. 4, process 400 may include detecting a strength of a first magnetic field component, a strength of a second magnetic field component, and a strength of a third magnetic field component, wherein the first magnetic field component, the second magnetic field component, and the third magnetic field component are perpendicular to each other (block 410). For example, the magnetic sensor may detect a strength of a first magnetic field component, a strength of a second magnetic field component, and a strength of a third magnetic field component, wherein the first magnetic field component, the second magnetic field component, and the third magnetic field component are perpendicular to each other, as described above.

As further shown in FIG. 4, process 400 may include determining a position of a first element based on the strength of the first magnetic field component and the strength of the second magnetic field component, wherein a position of a first magnet corresponds to the position of the first element (block 420). For example, the magnetic sensor may determine a position of a first element based on the strength of the first magnetic field component and the strength of the second magnetic field component, wherein a position of a first magnet corresponds to the position of the first element, as described above.

As further shown in FIG. 4, process 400 may include determining a position of a second element based on the strength of the third magnetic field component, wherein a position of a second magnet corresponds to the position of the second element (block 430). For example, the magnetic sensor may determine a position of a second element based on the strength of the third magnetic field component, wherein a position of a second magnet corresponds to the position of the second element, as described above.

Process 400 may include additional implementations, such as any single implementation or any combination of implementations described below and/or in connection with one or more other processes described elsewhere herein.

In a first implementation, a magnetic field of the first magnet is confined to the first magnetic field component and the second magnetic field component.

In a second implementation, alone or in combination with the first implementation, a magnetic field of the second magnet is confined to the second magnetic field component and the third magnetic field component.

In a third implementation, alone or in combination with one or more of the first and second implementations, a magnetic field of the second magnet has a constant effect on the first magnetic field component and the second magnetic field component at the magnetic sensor, irrespective of the selected position of the second element.

In a fourth implementation, alone or in combination with one or more of the first through third implementations, the magnetic sensor comprises a 3D Hall sensor.

In a fifth implementation, alone or in combination with one or more of the first through fourth implementations, the first magnet is a dipole magnet.

In a sixth implementation, alone or in combination with one or more of the first through fifth implementations, the second magnet is a dipole magnet.

In a seventh implementation, alone or in combination with one or more of the first through sixth implementations, the sensor system is included in a power tool.

Although FIG. 4 shows example blocks of process 400, in some implementations, process 400 includes additional blocks, fewer blocks, different blocks, or differently arranged blocks than those depicted in FIG. 4. Additionally, or alternatively, two or more of the blocks of process 400 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations.

It will be apparent that systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items,), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A sensor system, comprising:
a first magnet arranged such that a position of the first magnet corresponds to a position of a trigger element on a linear trajectory;
a second magnet arranged such that a position of the second magnet corresponds to a selected position of a selection element, the selected position being one of a plurality of selectable positions; and
a magnetic sensor to:
detect a strength of a first magnetic field component, a strength of a second magnetic field component, and a strength of a third magnetic field component,
wherein the first magnetic field component, the second magnetic field component, and the third magnetic field component are perpendicular to each other,
determine the position of the trigger element based on the strength of the first magnetic field component and the strength of the second magnetic field component, and
determine the selected position of the selection element based on the strength of the third magnetic field component.

2. The sensor system of claim 1, wherein a magnetic field of the first magnet is confined to the first magnetic field component and the second magnetic field component as the trigger element moves along the linear trajectory.

3. The sensor system of claim 1, wherein a magnetic field of the second magnet is confined to the second magnetic field component and the third magnetic field component as the selection element moves between selectable positions in the plurality of selectable positions.

4. The sensor system of claim 1, wherein a magnetic field of the second magnet has a constant effect on the first magnetic field component and the second magnetic field component at the magnetic sensor, irrespective of the selected position of the selection element.

5. The sensor system of claim 1, wherein the magnetic sensor comprises a three-dimensional (3D) Hall sensor.

6. The sensor system of claim 1, wherein the first magnet is a dipole magnet.

7. The sensor system of claim 1, wherein the second magnet is a dipole magnet.

8. The sensor system of claim 1, wherein the sensor system is included in a power tool.

9. A device, comprising:
a first element moveable along a first axis;
a first magnet affixed to the first element such that a position of the first magnet represents a position of the first element with respect to the first axis;
a second element rotatable about or moveable on a second axis;
a second magnet affixed to the second element such that a position of the second magnet represents a selected position of the second element with respect to the second axis, the selected position being one of a plurality of selectable positions; and
a magnetic sensor to:
determine the position of the first element based on a strength of a first magnetic field component and a strength of a second magnetic field component,
wherein the first magnetic field component is perpendicular to the second magnetic field component, and
determine the selected position of the second element based on a strength of a third magnetic field component,
wherein the third magnetic field component is perpendicular to the first magnetic field component and to the second magnetic field component.

10. The device of claim 9, wherein a magnetic field of the first magnet is confined to the first magnetic field component and the second magnetic field component as the first element moves along the first axis.

11. The device of claim 9, wherein a magnetic field of the second magnet is confined to the second magnetic field component and the third magnetic field component as the second element moves among selectable positions in the plurality of selectable positions.

12. The device of claim 9, wherein a magnetic field of the second magnet has a constant effect on the first magnetic field component and the second magnetic field component at the magnetic sensor, irrespective of the selected position of the second element.

13. The device of claim 9, wherein the magnetic sensor comprises a three-dimensional (3D) Hall sensor.

14. The device of claim 9, wherein the first magnet is a dipole magnet.

15. The device of claim 9, wherein the second magnet is a dipole magnet.

16. The device of claim 9, wherein the device is a power tool.

17. A method, comprising:
detecting, by a magnetic sensor, a strength of a first magnetic field component, a strength of a second magnetic field component, and a strength of a third magnetic field component,
wherein the first magnetic field component, the second magnetic field component, and the third magnetic field component are perpendicular to each other;
determining, by the magnetic sensor, a position of a first element based on the strength of the first magnetic field component and the strength of the second magnetic field component,
wherein a position of a first magnet corresponds to the position of the first element; and
determining, by the magnetic sensor, a position of a second element based on the strength of the third magnetic field component,
wherein a position of a second magnet corresponds to the position of the second element.

18. The method of claim 17, wherein a magnetic field of the first magnet is confined to the first magnetic field component and the second magnetic field component.

19. The method of claim 17, wherein a magnetic field of the second magnet is confined to the second magnetic field component and the third magnetic field component.

20. The method of claim 17, wherein a magnetic field of the second magnet has a constant effect on the first magnetic field component and the second magnetic field component at the magnetic sensor, irrespective of the position of the second element.

* * * * *